United States Patent
Breus et al.

(10) Patent No.: US 12,433,062 B2
(45) Date of Patent: Sep. 30, 2025

(54) METHOD FOR PRODUCING TEXTURED SOLAR WAFERS

(71) Applicant: Meyer Burger (Germany) GmbH, Hohenstein-Ernstthal (DE)

(72) Inventors: Vladimir Breus, Hohenstein-Ernstthal (DE); Arne Wissen, Hohenstein-Ernstthal (DE)

(73) Assignee: MEYER BURGER (GERMANY) GMBH, Hohenstein-Ernstthal (DE)

( * ) Notice: Subject to any disclaimer, the term of this patent is extended or adjusted under 35 U.S.C. 154(b) by 0 days.

(21) Appl. No.: 17/610,613

(22) PCT Filed: May 11, 2020

(86) PCT No.: PCT/DE2020/100397
§ 371 (c)(1),
(2) Date: Nov. 11, 2021

(87) PCT Pub. No.: WO2020/228904
PCT Pub. Date: Nov. 19, 2020

(65) Prior Publication Data
US 2022/0209031 A1    Jun. 30, 2022

(30) Foreign Application Priority Data
May 15, 2019  (EP) ..................... 19174699

(51) Int. Cl.
H10F 71/00    (2025.01)
H10F 77/70    (2025.01)
(52) U.S. Cl.
CPC ......... H10F 77/703 (2025.01); H10F 71/121 (2025.01)
(58) Field of Classification Search
None
See application file for complete search history.

(56) References Cited

FOREIGN PATENT DOCUMENTS

| CN | 108221050 | 6/2018 |
|---|---|---|
| JP | 2016225366 | 12/2016 |

(Continued)

OTHER PUBLICATIONS

Choi Sunho et al, "Cu-contamination of single crystalline silicon wafers with thickness of 100[mu]m during multi-wire sawing process", Solar Energy, Pergamon Press. Oxford, GB, Band 125, Jan. 5, 2016 (Jan. 5, 2016), Seite 198-206, XP029394706 DOI: 10.1016/J.SOLENER.2015.12.004 ISSN:0038-092X.

(Continued)

*Primary Examiner* — Dustin Q Dam
(74) *Attorney, Agent, or Firm* — DUANE MORRIS LLP; Gregory M. Lefkowitz; Randall C. Pyles

(57) ABSTRACT

The present invention relates to a method for producing solar wafers textured at least on one side, wherein in a first method step, sawn solar wafers with sawing damage are provided, and at the end of the last method step textured solar wafers with different size types of large and small pyramids are provided, and wherein the textured solar wafers can then be further processed to produce solar cells. The problem addressed by the present invention is that of providing an improved texturing method within the framework of the technology for the production of solar cells. This problem is solved by a method for producing textured solar wafers wherein in the first texture etching step the large pyramids are created in a low surface area density such that at the end of the method less than 30% of the textured surface of the solar wafer is occupied by the large pyramids; and in the second texture etching step the small pyramids are produced with a large surface area density.

10 Claims, 3 Drawing Sheets

(56) References Cited

FOREIGN PATENT DOCUMENTS

Figure 1:
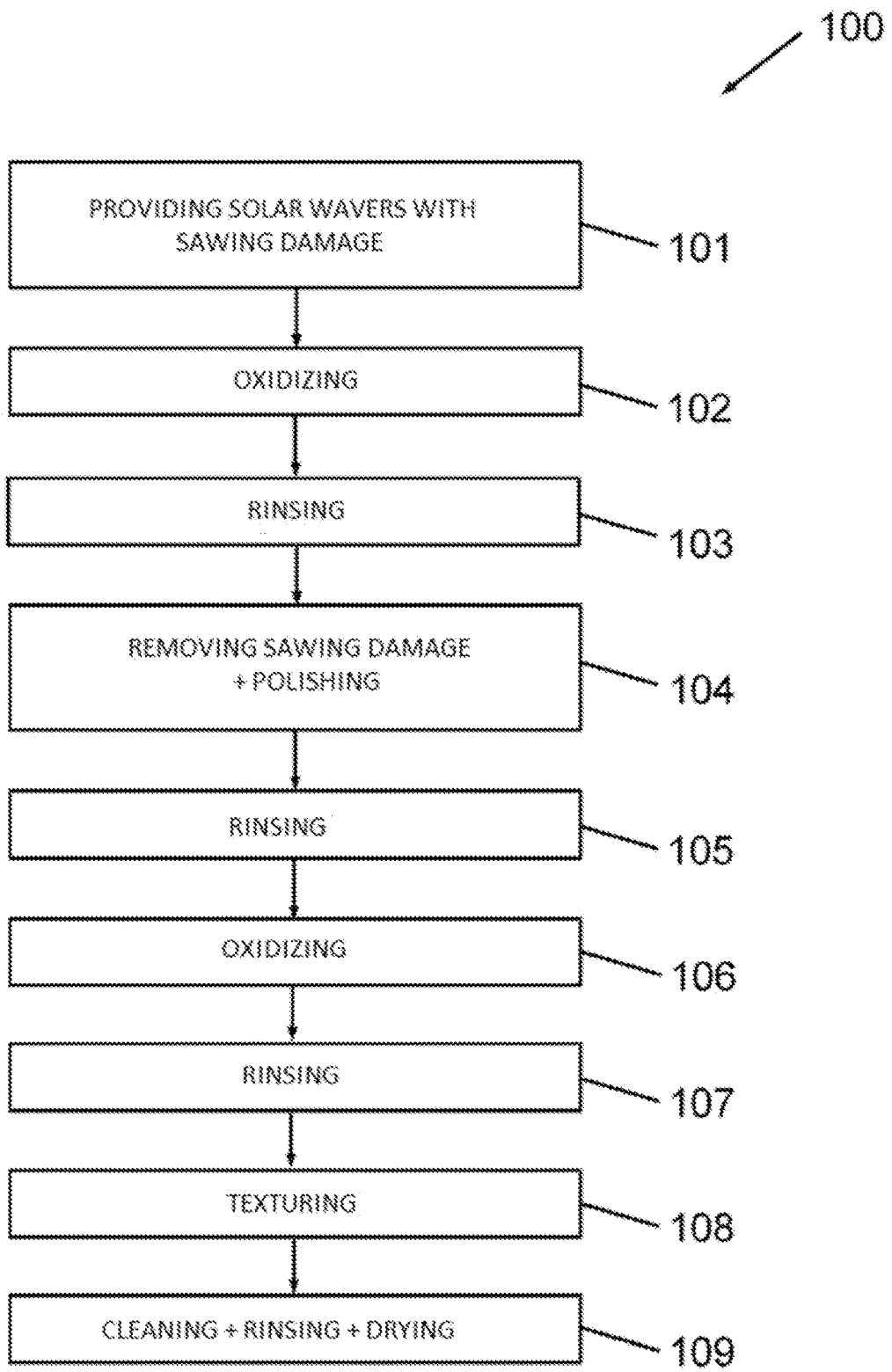

JP  2016225366 A  * 12/2016
WO  2013/142122      9/2013

OTHER PUBLICATIONS

Jose Nestor Ximello Quiebras, "Wet chemical textures for crystalline silicon solar cells", 2013, Seite 1-124, Abgerufen von: URL:https://d-nb.info/1045840572/34 XP055715379 [gefunden am Jul. 16, 2020].

Zheng Fang et al, "Standard Deviation Quantitative Characterization and Process Optimization of the Pyramidal Texture of Monocrystalline Silicon Cells", Materials, Band 13, Nr. 3, Jan. 24, 2020 (Jan. 24, 2020), Seite 564, XP055715356 DOI: 10.3390/ma13030564.

Fengyou Wang et al, "Insights into nucleation engineering in Si pyramidal texturing for high performance heterojunction solar cells applications", Journal of Alloys and Compounds., Band 752, Apr. 16, 2018 (Apr. 16, 2018), Seite 53-60, XP055639871 DOI: 10.1016/j.jallcom.2018.04.180 ISSN:0925-8388.

Kapila Wijekoon et al, "Effect of Additive and Etchant Concentration in Surface Morphology of Mono-Crystalline Silicon Solar Cells Textured with Non-Alcoholic Chemical Formulations", Proceedings of the 26th European Photovoltaic Solar Energy Conference, Seite 2015-2019, XP040637541 ISBN: 9783936338270.

Jan Kegel et al, "IPA-free Texturization of n-type Si Wafers: Correlation of Optical, Electronic and Morphological Surface Properties", Energy Procedia, Band 38, 2013, Seite 833-842, XP055639938 DOI: 10.1016/j.egypro.2013.07.353 ISSN:1876-6102.

Fengyou Wang et al, "Pyramidal texturing of silicon surface via inorganic-organic hybrid alkaline liquor for heterojunction solar cells", Journal of Power Sources, Band 293. Jun. 9, 2015 (Jun. 9, 2015), Seite 698-705, XP055639847 DOI: 10.1016/j.jpowsour.2015.05.124 ISSN:0378-7753.

Kegel, J., et al., "Over 20% conversion efficiency on silicon heterojunction solar cells by IPA-free substrate texturization," Applied Surface Science, 2014, vol. 30, pp. 56-62.

Ju, M. et al., "Influence of small size pyramid texturing on contact shading loss and performance analysis of Ag-screen printed mono crystalling silicon solar cells," Materials Science in Semiconductor Processing, 2018, vol. 85, pp. 68-75.

Gangopadhyay, U., et al., "A novel low cost texturization method for large area commercial mono=crystalline silicon solar cells," Solar Energy Materials & Solar Cells, 2006, vol. 90, pp. 3557-3567.

Al-Husseini, A.M., et al., "Influence of pyramid size on reflectivity of silicon surfaces textured using an alkaline etchant," Bull. Mater. Sci, 2019, 42:152.

Khanna, A., et al., "Influence of random pyramid surface texture on silver screen-printed contact formation of monocrystalline silicon wafer solar cells," Solar Energy Materials & Solar Cells, 2015, vol. 132, pp. 589-596.

* cited by examiner

METHOD FOR PRODUCING TEXTURED SOLAR WAFERS

CROSS-REFERENCE TO RELATED APPLICATIONS

This application is a § 371 national stage entry of International Application No. PCT/DE2020/100397, filed May 11, 2020, which claims priority to European Patent Application No. 19174699.9, filed May 15, 2019, the entire contents of which are incorporated herein by reference.

The present invention relates to a method for producing wafers textured on at least one side, wherein, in a first method step, sawn solar wafers with sawing damage are provided and, at the end of the last method step, textured solar wafers with different size types of large and small pyramids are provided, and wherein the textured solar wafers can subsequently be further processed into solar cells. In addition, the invention also relates to a solar cell produced using the method and to a production line used for carrying out the method.

In the production of solar cells, at least the front side of the solar cell provided primarily for the incidence of light is usually roughened or textured. This texturing reduces the reflection and increases the absorption of the incident light. Thus, the texturing leads to an increase in the efficiency of the solar cell. In addition, textured solar cell surfaces are often perceived as aesthetically pleasing. In addition to monofacial solar cells, there are also bifacial solar cells, which can leave light into the solar cell not only on their front side but also on their back side. Texturing can be produced both, the front side and the back side of the solar cell in order to generate a benefit. Solar cells are currently produced by the global solar cell industry predominantly from monocrystalline Si wafers and this will continue during the next couple of years. These monocrystalline solar wafers are usually textured with anisotropic etching agents, for example, with KOH-containing etching solutions, wherein on the etched surfaces pyramids with side surfaces in the 111-crystal planes of the silicon single crystal remain, which form the texturing on the solar wafer. A conventional texturing method that can be used industrially for texturing solar wafers is described in DE10 2008 014 166 B3.

Solar cells and their production methods have been considerably improved in recent years, the efficiency of the solar cells was increased, and production costs were reduced. Already today, the photovoltaics are the most cost-effective and environmentally friendly possibility of the electrical energy generation. In the future, it is necessary to further develop the solar cell manufacturing methods in order to further increase the performance of solar cells and to further reduce the costs of electrical energy obtained from solar radiation. High-performance solar cells, e.g., HJT solar cells, are very sensitive to contamination during the production method, contamination mechanisms must be correspondingly recognized, and their effects must be minimized.

It is therefore the object of the present invention to propose an improved texturing method within the scope of the production technology of solar cells.

This object is achieved by a method for producing textured solar wafers, wherein, in the first texture etching step, the large pyramids are created in a low surface density, so that at the end of the method less than 30% of the textured surface of the solar wafer is occupied by the large pyramids, wherein, in the second texture etching step, the small pyramids are produced with a large surface density. This method can be carried out in a particularly simple and cost-effective manner. The large pyramids are produced not only for the purpose of directing more light into the solar cell than with smooth solar cell surfaces. In addition, the large pyramids fulfil the purpose of providing small-scale contact regions between the solar wafer and the transport devices used in the production method of solar cells. The transport devices can be, for example, conveyor belts. At the remaining surface regions of the solar wafer, i.e., the surface regions with the small pyramids, contact with the conveyor belts or other device parts on which the solar wafers rest is thereby largely avoided. The boundary between large and small pyramids can be varied depending on the transport device used and is about at 4 μm. Abrasion of the texturing or small pyramids is thus minimized and the quality and the average efficiency of the solar cells produced increases. The surface regions of the solar wafer between the large pyramids are generally completely filled with small pyramids. The pyramids of different sizes are distinguished by their mechanical or optical function as transport pyramids and smaller light-collecting pyramids. Since only the large pyramids come into contact with the transport devices, the solar cells can be transported without the small pyramids or light-collecting pyramids coming into contact with the transport devices. Small pyramids are understood in this context to mean all pyramids which are smaller than the large pyramids. During the production method, the large pyramids have the task of transport pyramids, which come in contact with transport devices, so that the solar wafers lie exclusively with the tips of the large pyramids on the transport devices. From a statistical point of view, the size distribution of the pyramids can be a 2-fold distribution, which is sometimes also referred to as a bimodal, two-tip or two-peak distribution. However, the size distribution can also be a multiple distribution, where the differently sized pyramids are assigned to the two categories of large and small pyramids on the basis of their function. Within the scope of the current invention a 2-fold or multiple distribution with at least two different size classes of produced pyramids is targeted.

The first texture etching step of the method according to the invention can be carried out in a second method step that immediately follows the first method step, in which solar wafers with sawing damage are provided. Thus, the conventional method steps that are used for the removal of superficial crystal damage on the surface of the solar wafer, which occurred during sawing of a brick, are dispensed with. In addition to the task of producing few large pyramids, the first texture etching step also takes over the additional task of removing sawing damage. Compared to conventional methods, considerably less chemicals are consumed in the method according to the invention.

The first texture etching step can be carried out with a first texture etching solution containing between 1 and 15% KOH or NaOH or NH$_4$OH or TMAH. These basic chemicals have the desired anisotropic etching effect required to produce the pyramids. The specific etching parameters, in particular the concentration and temperature used, are determined by means of a person skilled in the art on the basis of local target parameters, in particular, they are optimized with regard to the texture topology, the throughput time and the chemical consumption. The first texture etching solution may contain a texture additive. Texture additives and their effects are known in the prior art, and, therefore, the description thereof is unnecessary for a person skilled in the art. The texture additives are temporarily locally deposited on the silicon surface, so that they locally mask the surface and can cause the formation of pyramid tips. Examples of additives, which can be used, are commercially available texture additives, surfactants, simple alcohols or multiple alcohols, organic acids, esters, ethers, aldehydes, ketones, saccharides (mono-, di-, tri-, oligo- or poly-). The first texture etching solution contains fewer etching agents than a conventional etching bath for removal of sawing damage, which typically contains 20% KOH. In the method according to the invention, both the preparation and the re-dosing of the texture etching solution are carried out using fewer etching agents than are used in a conventional method. When using the method according to the invention, up to 45% savings in chemicals and in corresponding cost could be shown.

The second texture etching step may be carried out with a second texture etching solution containing between 1 and 5% KOH or NaOH or $NH_4OH$ or TMAH and a texture additive. Examples of additives, which can be used, are commercially available texture additives, surfactants, alcohols (simple & multiple), organic acids, esters, ethers, aldehydes, ketones, saccharides (mono-, di-, tri-, oligo-, poly-).

At least one rinsing step can be carried out between the first texture etching step and the second texture etching step. With rinsing steps, various chemical treatments can be separated well from one another, and the individual process steps can be well controlled. In particular in the mass business of solar cell fabrication, minimization of manufacturing costs is very important. An omission of rinsing steps can therefore also be decided even when therewith other disadvantages have to be accepted. In principle, the texturing of the solar cells can be carried out with only the two texture etching steps. At least one cleaning step can be carried out between the first texture etching step and the second texture etching step and/or at least one rinsing step. With cleaning steps, the influence of random impurities can be reduced and the yield of textured solar wafers with uniformly highest quality can be increased. The cleaning step can be carried out, for example, in an SC1 bath or a pSC1 bath (modified standard cleaning/pseudo-standard clean), or in a solution containing water, ozone and HCl, or in a solution containing water, ozone, HF and HCl, or in solutions containing HF and HCl, or in HCl solutions at temperatures between 10° C. and 80° C., or in $HNO_3$ solutions at 50-80° C., or in DI water at 10-80° C., or in diluted KOH solutions with a concentration of ≤1% at temperatures between 50 and 90° C. The cleaning can be assisted by ultrasound. Instead of a cleaning bath, an oxidation can also be used in an ozone-containing gas atmosphere. In principle, however, the texturing steps also function without intermediate cleaning steps.

In the method according to the invention, the large pyramids can be produced on less than 10% of the textured surface, preferably on 5% of the textured surface, and the small pyramids can be produced on more than 90%, preferably on 95%, of the textured surface of the solar wafer. The smaller the number of large pyramids, the smaller are the total overall summed contact surfaces between the solar wafer and transport devices, which are used in the production of solar cells from the solar wafers. In the case of smaller contact surfaces, less abrasion or less transport damage can result. As a result, impurities can be reduced, and the efficiencies of the solar cells produced can be increased.

The method for producing textured solar wafers can be reflected directly in the production line used for carrying out the method. In this respect, the invention also relates to a production line with corresponding baths for carrying out the method according to the invention. The production line is equipped according to the desired result. If, for example, the solar wafer is to be textured only on one side without a side of the wafers being masked by a protective layer, then the production line is correspondingly equipped for one-sided processing of the wafer. If a two-sided texturing is desired, then the wafers are completely immersed in baths and correspondingly equipped production lines are used. In the production line according to the invention, a first texture etching station is arranged as a first wet-chemical processing station and a second first texture etching station is arranged at a production line position further back. Thereby a simplification of the production line section for texturing is achieved.

In a further aspect, the present invention relates to a solar cell, which is produced from a solar wafer that is produced using the method according to the invention. In the finished solar cell, the pyramids having different sizes result from the use of the method according to the invention during the production of the solar cells. The small surfaces that are in contact with transport devices only at the tips of the large pyramids lead to higher yields, higher efficiencies and lower manufacturing costs compared to using conventional texturing methods. This applies in particular to heterojunction solar cells, which are more sensitive to impurities, transport damage and abrasion during the production method than other solar cell types.

The solar cell may have a thickness below 150 µm. The method according to the invention is compatible with very thin solar wafers with a thickness of, for example, 120 µm or 100 µm. In the case of very thin solar wafers, the advantageous effects of the method according to the invention become more effective than in the case of thicker wafers, since in the case of thinner wafers the ratio of surface to volume is greater, and as a result the cleaner and more defined surface on thinner wafers unfolds a stronger effect than on thicker wafers.

Various options of the present invention may be combined with each other at the discretion of a person skilled in the art. An indication of many combinations and configurations would more disturb a person skilled than be useful to him. Options indicated randomly one after the other must not be misinterpreted as a mandatory feature interpretation.

Figure 2:
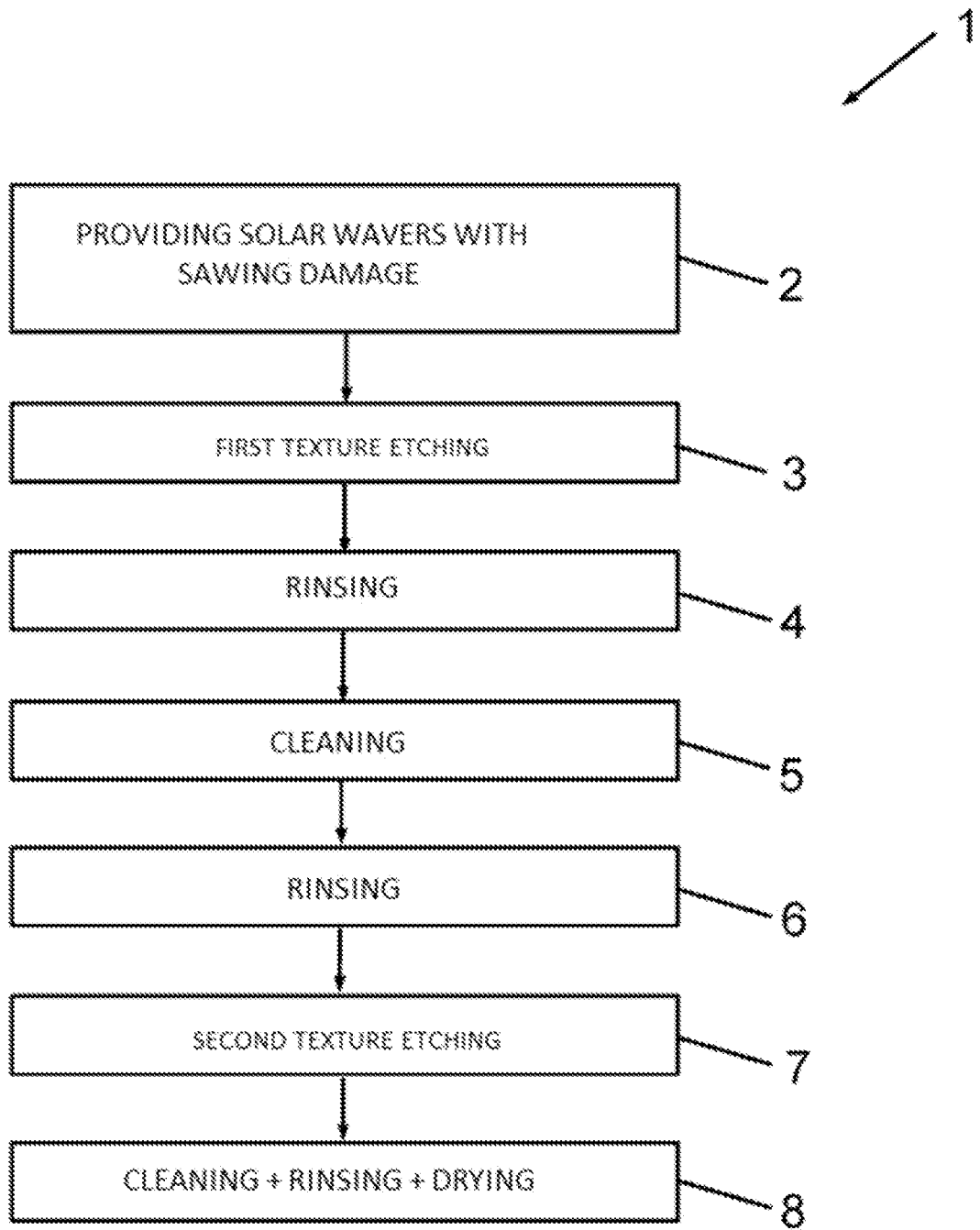
Figure 3:
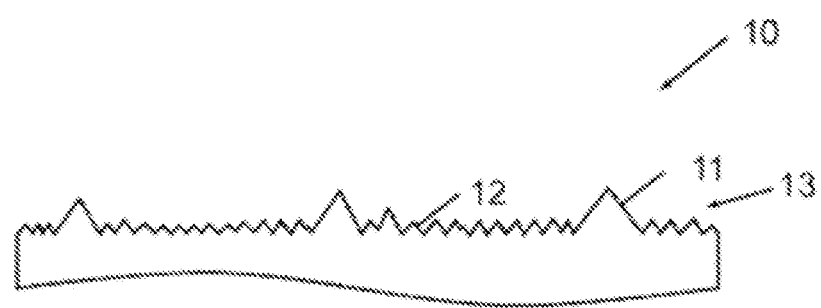
Figure 4:
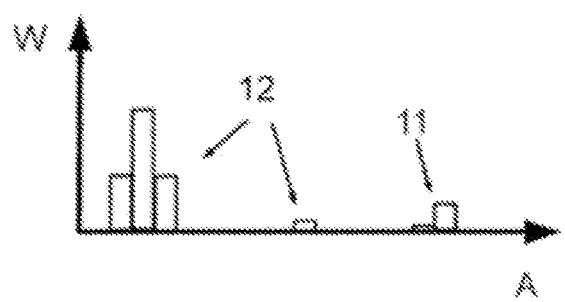

The present invention will be explained further below with reference to figures, wherein FIG. 1 shows a conventional method for producing textured solar wafers;

FIG. 2 shows a method according to the invention for producing textured solar wafers, FIG. 3 shows a schematic cross section through a textured surface section of a solar wafer, and FIG. 4 shows an exemplary size distribution of texture pyramids.

FIG. 1 illustrates a conventional prior art texturing method 100 to provide a reference for subsequent presentation of the method according to the invention in FIG. 2. In method 100 according to the prior art, solar wafers with sawing damage are provided in a first method step 101. Then, in a method step 102, the wafers are chemically oxidized in a liquid bath, wherein the oxidizing interacts with the subsequent etching step. Following a rinsing 103 the method step 104 comprises removing sawing damage and chemical polishing in a commercially available sawing damage etching bath containing 20% KOH. In the next step 105, a rinsing is carried out and, then in step 106, an oxidizing is carried out to prepare the texturing. After a further rinsing step 107, the texturing step 108 is carried out. In the last method step 109, the wafers are finally treated, in particular cleaned, rinsed and dried. As a result, textured solar wafers are then present, which serve as intermediate products for the later production of solar cells.

FIG. 2 illustrates an exemplary embodiment of the method according to the invention. In the first method step 2, sawn solar wafers with sawing damage are provided. Immediately subsequently, the first texture etching step 3 takes place, in which the large pyramids are produced. In the exemplary embodiment presented, the KOH concentration is 3%. In comparison to a standard method using an etching damage removal bath with a KOH concentration of 20%, 45% of the total consumed KOHs and corresponding costs are saved. Subsequently, a rinsing step 4, a cleaning step 5 and a further rinsing step 6 are carried out. In the cleaning step 5, a solution containing ozone and HCl is used in the present case. Since ozone can be produced cost-effectively from oxygen, this cleaning has lowest costs. Then, in the second texture etching step 7, the finishing of the large pyramids 11 and the production of the small pyramids 12 takes place. Method step 8 represents the completion of the method according to the invention for producing textured solar wafers. In the presented exemplary embodiment, the final method step 8 comprises a rinsing sub-step, a cleaning sub-step, a further rinsing sub-step and a drying sub-step. In other exemplary embodiments, the final method step 8 is carried out in a modified manner. After the final method step 8, the method 1 according to the invention for producing textured solar wafers 10 is terminated.

FIG. 3 schematically shows one of the two surfaces 13 textured according to the invention of a textured solar wafer 10 in a cross section through a surface section of the solar wafer 10. In this cross section, a distinction can be made on the basis of different sizes between large pyramids 11 and small pyramids 12. For example, the large pyramids 11 have a height of 6 µm and most small pyramids 12 have a height of 2 µm.

FIG. 4 outlines possible probabilities W of the surface occupancy of the solar wafer with pyramids with base areas A of different sizes. From the size of the bars, it can be seen that the large pyramids 11 with large base areas A have a lower probability on the surface of the solar wafer than small pyramids 12. In this exemplary embodiment, the small pyramids 12 include both the small pyramids of approximately the same size and also medium-size pyramids. The medium-size pyramids are sufficiently small, so that the medium-sized pyramids of a solar wafer resting with the large pyramids 11 on a transport device do not come into contact with the transport device. Consequently, no abrasion occurs on the medium-sized pyramids and, here, these are to be assigned to the category "small pyramids 12".

REFERENCE NUMERALS

1 Method of producing solar wafers textured on at least one side
2 First method step: Providing sawn solar wafers with sawing damage
3 First texture etching step
4 Rinsing step
5 Cleaning step
6 Rinsing step
7 Second texture etching step
8 Final method step, the intermediate product of which are textured solar wafers
10 Solar wafer
11 Large pyramids
12 Small pyramids
13 Textured surface(s) of the solar wafer A Base area of a texture pyramid
W Probability of the occurrence of a pyramid size
100 Prior Art Method
101 First method step: Providing sawn solar wafers with sawing damage
102 Oxidizing
103 Rinsing
104 Removing sawing damage and polishing
105 Rinsing
106 Oxidizing
107 Rinsing
108 Texturing
109 Final method step

The invention claimed is:

1. A method for producing solar wafers textured on at least one side, wherein,
   in a first method step, sawn solar wafers with sawing damage are provided and, at an end of a last method step, textured solar wafers with different size types of large and small pyramids are provided,
   the large pyramids have a height above 4 µm and the small pyramids have a height below 4 µm,
   the textured solar wafers can subsequently be further processed into solar cells,
   the method includes a first texture etching step and a second texture etching step,
   in the first texture etching step, by using a first texture etching solution containing from 1 to 15% KOH or NaOH or NH$_4$OH or TMAH the large pyramids are created in a lower surface density, so that the first texture etching step-solution removes the sawing damage and at an end of the method less than 30% of a textured surface of the solar wafers is occupied by the large pyramids,
   in the second texture etching step, by using a second texture etching solution that is a different etching solution composition than the first texture etching solution, the second texture etching solution containing from 1 to 5% KOH or NaOH or NH$_4$OH or TMAH and a texture additive, the small pyramids are produced with a greater surface density, and
   the large pyramids and the small pyramids occur in a statistical 2-fold or multiple distribution.

2. The method according to claim 1, wherein the first texture etching step immediately follows the first method step in a second method step.

3. The method according to claim 1, wherein the first texture etching solution contains a texture additive.

4. The method according to claim 1, wherein at least one rinsing step is carried out between the first texture etching step and the second texture etching step.

5. The method according to claim 1, wherein at least one cleaning step is carried out between the first texture etching step and the second texture etching step and/or at least one rinsing step.

6. The method according to claim 1, wherein that the large pyramids are produced on less than 10% of the textured surface and the small pyramids are produced on more than 90% of the textured surface of the solar wafer.

7. A production line, wherein the production line for carrying out the method according to claim 1 is equipped with corresponding baths, wherein, in the production line, a first texture etching station is arranged as a first wet-chemical processing station and a second first texture etching station is arranged at a production line position located further back.

8. A Solar cell, wherein the solar cell is produced from a solar wafer that is produced using the method according to claim 1 with large pyramids and the small pyramids being present in a statistical 2-fold or multiple distribution within solar wafer texturing.

9. The solar cell according to claim 8, wherein the solar cell has a thickness below 150 μm.

10. The method according to claim 1, wherein the large pyramids have a height of 6 μm and most of the small pyramids have a height of 2 μm.

* * * * *